US012781344B2

(12) United States Patent
Heo et al.

(10) Patent No.: US 12,781,344 B2
(45) Date of Patent: Nov. 3, 2026

(54) THIN FILM FORMATION METHOD

(71) Applicant: JUSUNG ENGINEERING CO., LTD., Gwangju-Si (KR)

(72) Inventors: Jeong Heo, Gwangju-Si (KR); Duck Ho Kim, Gwangju-Si (KR); Yong Hyun Kim, Gwangju-Si (KR); Chang Su Mha, Gwangju-Si (KR); Chang Kyun Park, Gwangju-Si (KR); Yong Hyun Lee, Gwangju-Si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 231 days.

(21) Appl. No.: 18/559,780

(22) PCT Filed: Mar. 11, 2022

(86) PCT No.: PCT/KR2022/003477

§ 371 (c)(1),
(2) Date: Nov. 8, 2023

(87) PCT Pub. No.: WO2022/239948

PCT Pub. Date: Nov. 17, 2022

(65) Prior Publication Data

US 2024/0376601 A1 Nov. 14, 2024

(30) Foreign Application Priority Data

May 11, 2021 (KR) ........................ 10-2021-0060988

(51) Int. Cl.
*C23C 16/455* (2006.01)
*C23C 16/02* (2006.01)
(Continued)

(52) U.S. Cl.
CPC .... *C23C 16/45553* (2013.01); *C23C 16/0272* (2013.01); *C23C 16/303* (2013.01); *C23C 16/52* (2013.01); *C23C 16/56* (2013.01)

(58) Field of Classification Search
None
See application file for complete search history.

(56) References Cited

U.S. PATENT DOCUMENTS

2004/0191413 A1* 9/2004 Park .................. C23C 16/45538 118/723 R
2006/0138446 A1 6/2006 Yoo et al.
(Continued)

FOREIGN PATENT DOCUMENTS

CN 111048637 A 4/2020
CN 112397618 A 2/2021
(Continued)

OTHER PUBLICATIONS

Written Opinion for PCT/KR2022/003477, mailed Jun. 13, 2022.
International Search Report for PCT/KR2022/003477, mailed Jun. 13, 2022.

*Primary Examiner* — Mandy C Louie
(74) *Attorney, Agent, or Firm* — Renaissance IP Law Group LLP

(57) ABSTRACT

The present disclosure relates to a thin film forming method, and more particularly, to a thin film forming method for forming a gallium nitride thin film.
In accordance with an exemplary embodiment, a thin film forming method includes: loading a substrate into a process space of a chamber; and forming a gallium nitride thin film on the substrate, and the forming of the gallium nitride thin film includes: supplying a source gas containing gallium onto the substrate; supplying a reactant gas containing nitrogen onto the substrate; and activating and supplying a post-treatment gas containing hydrogen onto the substrate.

17 Claims, 4 Drawing Sheets

10 : 12, 14
20 : 22, 24
30 : 32, 34, 36, 38
40 : 42, 44

(51) Int. Cl.

| | |
|---|---|
| ***C23C 16/30*** | (2006.01) |
| ***C23C 16/52*** | (2006.01) |
| ***C23C 16/56*** | (2006.01) |

(56) References Cited

U.S. PATENT DOCUMENTS

| | | | | |
|---|---|---|---|---|
| 2013/0012003 | A1* | 1/2013 | Haukka | H01L 21/0262<br>257/E21.108 |
| 2013/0130481 | A1* | 5/2013 | Chua | H01L 21/0262<br>257/E21.108 |
| 2014/0191262 | A1 | 7/2014 | Kraus et al. | |
| 2021/0193454 | A1* | 6/2021 | Ko | H10P 14/6339 |

FOREIGN PATENT DOCUMENTS

| | | | |
|---|---|---|---|
| JP | 2000195801 | A | 7/2000 |
| JP | 2001168040 | A | 6/2001 |
| JP | 2003517731 | A | 5/2003 |
| JP | 2016530708 | A | 9/2016 |
| KR | 20090028289 | A | 3/2009 |
| KR | 20120092043 | A | 8/2012 |
| KR | 20170120443 | A | 10/2017 |
| TW | 201331987 | A | 8/2013 |
| TW | 202032811 | A | 9/2020 |
| TW | 202034385 | A | 9/2020 |
| WO | 2012173824 | A2 | 12/2012 |
| WO | 2019225184 | A1 | 11/2019 |
| WO | 2020139683 | A1 | 7/2020 |

* cited by examiner

THIN FILM FORMATION METHOD

TECHNICAL FIELD

The present disclosure relates to a thin film forming method, and more particularly, to a thin film forming method for forming a gallium nitride thin film.

BACKGROUND ART

A thin film transistor (TFT) is used as a switching circuit in a semiconductor element or a display device. The thin film transistor has an active layer that forms a channel region between a gate electrode, a source electrode, and a drain electrode.

Typically, the active layer of the thin film transistor is made of amorphous silicon or crystalline silicon. However, when the active layer is made of crystalline silicon, the thin film transistor has a slow response speed and a heavy weight because a glass substrate is used as a substrate for forming the active layer. Also, since the thin film transistor is not bent in this case, the thin film transistor may not be used for a flexible display device. Thus, researches for using a gallium nitride thin film having a high carrier concentration and an excellent electrical conductivity as the active layer of the thin film transistor are actively performed to realize a high speed element, i.e., an element having high mobility.

The gallium nitride thin film is generally formed by a metal organic chemical vapor deposition (MOCVD) method. In the metal organic chemical vapor deposition method, the gallium nitride thin film is deposited in a state in which a temperature of the substrate is adjusted to a high temperature of about 1200° C. That is, when the substrate is maintained at the high temperature of about 1200° C., the gallium nitride thin film may be deposited onto the substrate.

However, as the gallium nitride thin film is formed in the state in which the substrate is heated at the high temperature, the thin film formed on the substrate may be damaged. This may cause a defect or degrade a function of the thin film transistor, and particularly, quality and reliability of the semiconductor element or the display device that requires a stable switching operation may be greatly degraded.

RELATED ART DOCUMENT

Patent Document (Patent document 1) KR10-2017-0120443 A

DISCLOSURE OF THE INVENTIVE CONCEPT

Technical Problem

The present disclosure provides a thin film forming method capable of forming a gallium nitride thin film at a low temperature.

Technical Solution

In accordance with an exemplary embodiment, a thin film forming method includes: loading a substrate into a process space of a chamber; and forming a gallium nitride thin film on the substrate, and the forming of the gallium nitride thin film includes: supplying a source gas containing gallium onto the substrate; supplying a reactant gas containing nitrogen onto the substrate; and activating and supplying a post-treatment gas containing hydrogen onto the substrate.

The forming of the gallium nitride thin film may be performed by controlling a temperature of the process space to be equal to or less than 600° C.

The supplying of the reactant gas may supply the reactant gas onto the substrate through a supply path different from that of the source gas.

The supplying of the reactant gas may activate and supply the reactant gas, and the forming of the gallium nitride thin film may be performed by controlling a temperature of the process space to be equal to or less than 350° C.

The forming of the gallium nitride thin film may further include activating and supplying a pre-treatment gas containing hydrogen onto the substrate before the supplying of the reactant gas.

The forming of the gallium nitride thin film may further include purging the source gas before the activating and supplying of the pre-treatment gas.

The forming of the gallium nitride thin film may further include purging the reactant gas before the activating and supplying of the post-treatment gas.

The source gas may include a trimethyl gallium (TMGa) gas, the reactant gas may include an ammonia ($NH_3$) gas, and the post-treatment gas may include a hydrogen ($H_2$) gas.

The thin film forming method may further include forming a buffer layer on the substrate before the forming of the gallium nitride thin film, and the buffer layer may include an aluminum nitride thin film.

The forming of the gallium nitride thin film may perform, a plurality of times, a process cycle including the supplying of the source gas, the supplying of the reactant gas, and the activating and supplying of the post-treatment gas.

The forming of the gallium nitride thin film may further include supplying a dopant gas onto the substrate, and the supplying of the dopant gas may supply the dopant gas simultaneously with or after the supplying of the source gas.

The dopant gas may include a p-type dopant gas or an n-type dopant gas, the p-type dopant gas may include a bis-cyclopentadienyl magnesium (Cp2Mg) gas, and the n-type dopant gas may include a diisopropylaminosilane (DIPAS) gas.

Advantageous Effects

According to the exemplary embodiment, as the gallium nitride thin film is formed through the low temperature process, the substrate or the gallium nitride thin film may be prevented from being damaged by the high temperature heat. Also, the time for increasing the temperature of the substrate to form the gallium nitride thin film may be saved, and thus, the time for manufacturing the semiconductor element or the display device may be reduced.

Also, according to the exemplary embodiment, the gallium nitride thin film having the crystalline structure with the high carrier concentration and the excellent electrical conductivity may be formed through the low temperature process.

MODE FOR CARRYING OUT THE INVENTIVE CONCEPT

Figure 1:
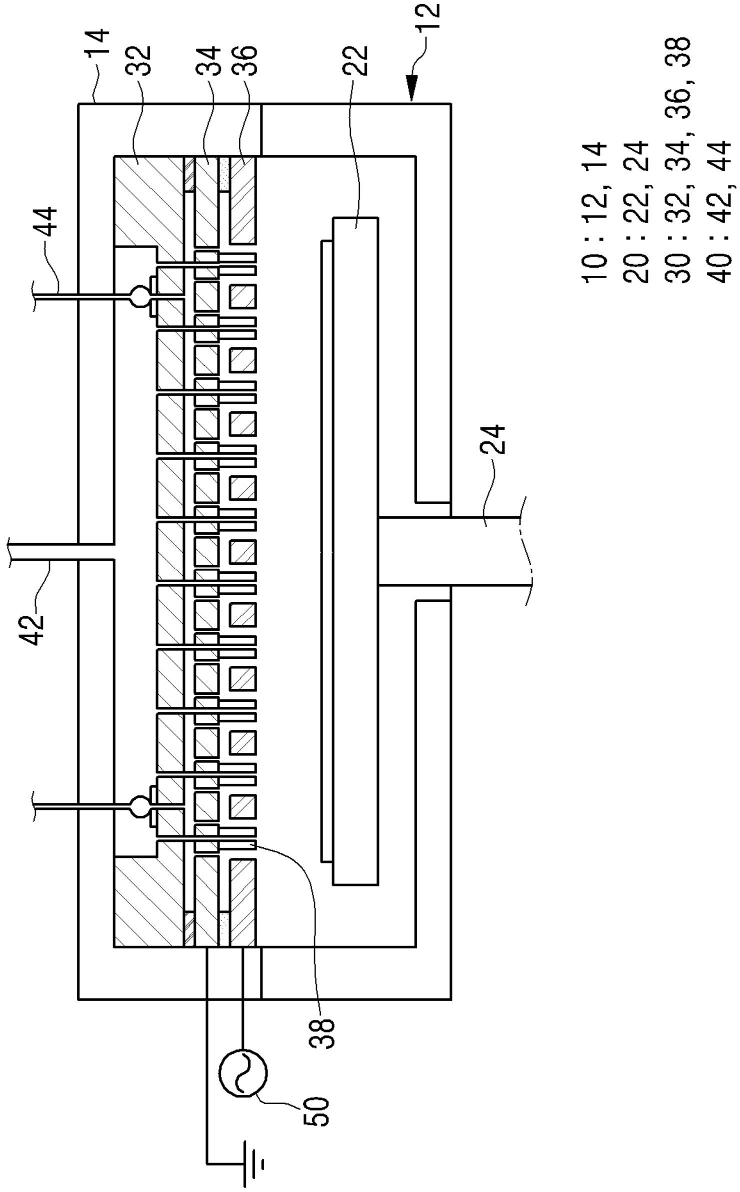
FIG. 1 is a schematic view illustrating a deposition apparatus in accordance with an exemplary embodiment.

Hereinafter, exemplary embodiments of the present inventive concept will be described in detail with reference to the accompanying drawings. The present inventive concept may, however, be embodied in different forms and should not be construed as limited to the embodiments set forth herein. Rather, these embodiments are provided so that the present inventive concept will be thorough and complete, and will fully convey the scope of the present inventive concept to those skilled in the art.

It will also be understood that when a layer, a film, a region or a plate is referred to as being 'on' another one, it can be directly on the other one, or one or more intervening layers, films, regions or plates may also be present.

Also, spatially relative terms, such as "above" or "upper" and "below" or "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In the drawings, the thicknesses of layers and regions are exaggerated for clarity. In the figures, like reference numerals refer to like elements throughout.

FIG. 1 is a schematic view illustrating a deposition apparatus in accordance with an exemplary embodiment.

Referring to FIG. 1, a deposition apparatus in accordance with an exemplary embodiment, which is for depositing a thin film, i.e., a gallium nitride thin film, includes: a chamber 10; a substrate support unit 20 disposed in the chamber 10 and supporting a substrate provided in the chamber 10; a gas injection unit 30 disposed in the chamber 10 to face the substrate support unit 20 and injecting a process gas toward the substrate support unit 20; and a RF power source 50 applying a RF power to generate plasma in the chamber 10. Also, the deposition apparatus may further include a gas supply unit 40 for supplying a gas to the gas injection unit 30 and a control unit (not shown) for controlling the RF power source 50. Here, the gas injection unit 30 includes a first gas supply path for supplying a first gas, e.g., a source gas, and a second gas supply path for supplying a second gas, e.g., a reactant gas, and the first gas supply path and the second gas supply path are separated.

The chamber 10 has a predetermined process space and maintains sealing thereof. The chamber 10 may include: a body 12 including an approximately circular or square flat portion and a sidewall portion extending upward from the flat portion and having a predetermined process space; and a cover 14 disposed on the approximately circular or square body 12 and to maintain the sealing of the chamber 10. However, the exemplary embodiment is not limited to the shape of the chamber 10. For example, the chamber 10 may be manufactured into various shapes in correspondence to a shape of a substrate.

An exhaust hole (not shown) may be formed in a predetermined area of a bottom surface of the chamber 10, and an exhaust pipe (not shown) connected to the exhaust hole may be disposed outside the chamber 10. Also, the exhaust pipe may be connected with an exhaust device (not shown). A vacuum pump such as a turbo-molecular pump may be used as the exhaust device. Thus, the inside of the chamber 10 may be vacuum-suctioned by the exhaust device to a predetermined reduced-pressure atmosphere, e.g., a predetermined pressure of 0.1 mTorr or less. The exhaust pipe may be installed on a side surface of the chamber 10 below the substrate support unit 20 that will be described later in addition to being installed on the bottom surface of the chamber 10. Also, a plurality of exhaust pipes and exhaust devices connected thereto may be further installed to reduce a time for exhausting.

Also, a substrate loaded into the chamber 10 for a thin film forming process may be seated on the substrate support unit 20. Here, the substrate may include various substrates for forming the gallium nitride (GaN) thin film. For example, the substrate may be one of a sapphire substrate, a glass substrate, and a silicon wafer. Here, the substrate support unit 20 may include, e.g., an electrostatic chuck to absorb and maintain the substrate by using an electrostatic force so that the substrate is seated and supported. Alternatively, the substrate support unit 20 may support the substrate by using vacuum absorption or a mechanical force.

The substrate support unit 20 may have a shape corresponding to that of the substrate, e.g., a circular shape or a square shape. The substrate support unit 20 may include a substrate support 22 on which the substrate is seated and an elevator 24 disposed below the substrate support 22 to elevate the substrate support 22. Here, the substrate support 22 may be manufactured larger than the substrate, and the elevator 24 may support at least one area, e.g., a central portion, of the substrate support 22 and move the substrate support 22 to be adjacent to the gas injection unit 30 when the substrate is seated on the substrate support 22. Also, a heater (not shown) may be installed in the substrate support 22. The heater generates heat at a predetermined temperature and heats the substrate support 22 and the substrate seated on the substrate support 22 so that a thin film is uniformly deposited on the substrate.

The gas supply unit 40 may pass through the cover 14 of the chamber 10 and include a first gas supply part 42 and a second gas supply part 44 for respectively supplying a first gas and a second gas to the gas injection unit 30. In the thin film deposition process, the first gas may include a source gas, and the second gas may include a reactant gas. However, each of the first gas supply part 42 and the second gas supply part 44 does not necessarily provide one gas. Each of the first gas supply part 42 and the second gas supply part 44 may simultaneously supply a plurality of gases or supply a gas selected from the plurality of gases.

For example, the first gas supply part 42 may supply a gas containing gallium (Ga) as the source gas, and the second gas supply part 44 may supply a gas containing nitrogen (N) as the reactant gas. Here, the source gas, i.e., the gas containing gallium, may include a trimethyl gallium (TMGa) gas, and the reactant gas, i.e., the gas containing nitrogen, may include an ammonia ($NH_3$) gas.

The gas injection unit 30 is installed in the chamber 10, e.g., installed on a bottom surface of the cover 14, and the first gas supply path for injecting and supplying the first gas onto the substrate and the second gas supply path for injecting and supplying the second gas onto the substrate are formed in the gas injection unit 30. As the first gas supply path and the second gas supply path are independently and separately formed, the first gas and the second gas may be separately supplied onto the substrate instead of being mixed in the gas injection unit 30.

The gas injection unit 30 may include an upper frame 32 and a lower frame 34. Here, the upper frame 32 is detachably coupled to the bottom surface of the cover 14, and at the same time, a portion of a top surface, e.g., a central portion of the top surface, is spaced a predetermined distance from the bottom surface of the cover 14. Accordingly, the first gas supplied from the first gas supply part 42 may be diffused in a space between a top surface of the upper frame 32 and the bottom surface of the cover 14. Also, the lower frame 34 is spaced a predetermined distance from a bottom surface of the upper frame 32. Accordingly, the second gas supplied from the second gas supply part 44 may be diffused in a space between a top surface of the lower frame 34 and the bottom surface of the upper frame 32. The upper frame 32 and the lower frame 34 may be connected along outer circumference surfaces thereof to form a spaced space therebetween and be integrated with each other. Alternatively, the outer circumference surfaces of the upper frame 32 and the lower frame 34 may be sealed by a separate sealing member.

The first gas supply path may be formed so that the first gas supplied from the first gas supply part 42 is diffused in the space between the bottom surface of the cover 14 and the upper frame 32 and supplied into the chamber 10 through the upper frame 32 and the lower frame 34. Also, the second gas supply path may be formed so that the second gas supplied from the second gas supply part 44 is diffused in the space between the bottom surface of the upper frame 32 and the top surface of the lower frame 34 and supplied into the chamber 10 through the lower frame 34. The first gas supply path and the second gas supply path may not communicate with each other, and thus the first gas and the second gas may be separately supplied into the chamber 10 from the gas supply unit 40 through the gas injection unit 30.

A first electrode 38 may be installed on the bottom surface of the lower frame 34, and a second electrode 36 may be spaced a predetermined distance from a lower side of the lower frame 34 and an outer side of the first electrode 38. Here, the lower frame 34 and the second electrode 36 may be connected along outer circumferential surfaces thereof. Alternately, the outer circumferential surfaces of the lower frame 34 and the second electrode 36 may be sealed by a separate sealing member.

As described above, when the first electrode 38 and the second electrode 36 are installed, the first gas may be injected onto the substrate through the first electrode 38, and the second gas may be injected onto the substrate through a spaced space between the first electrode 38 and the second electrode 36.

A RF power may be applied from the RF power source 50 to one of the lower frame 34 and the second electrode 36. In FIG. 1, a structure in which the lower frame 34 is grounded, and the RF power is applied to the second electrode 36 is illustrated as an example. When the lower frame 34 is grounded, the first electrode 38 installed on the bottom surface of the lower frame 34 is also grounded. Thus, when the RF power is applied from the RF power source 50 to the second electrode 36, a first activation region, i.e., a first plasma region, may be formed between the gas injection unit 30 and the substrate support unit 20, and a second activation region, i.e., a second plasma region, may be formed between the first electrode 38 and the second electrode 36.

Thus, when the second gas is injected through the spaced space between the first electrode 38 and the second electrode 36, the second gas may be activated in a region between the first electrode 38 and the second electrode 36, which corresponds to the inside of the gas injection unit 30, i.e., a region from the second plasma region to the first plasma region. Thus, the second gas may be activated in the gas injection unit 30 and injected onto the substrate in the deposition apparatus in accordance with an exemplary embodiment. Also, as the first gas supply path for supplying the first gas and the second gas supply path for supplying the second gas are separately formed, the source gas and the reactant gas may be distributed and injected through an optimized supply path for depositing the thin film as an example.

Hereinafter, the thin film forming method in accordance with an exemplary embodiment will be described in detail with reference to FIGS. 2 and 3. When the thin film forming method in accordance with an exemplary embodiment is described, a description overlapping that of the above-described substrate processing apparatus will be omitted.

Figure 2:
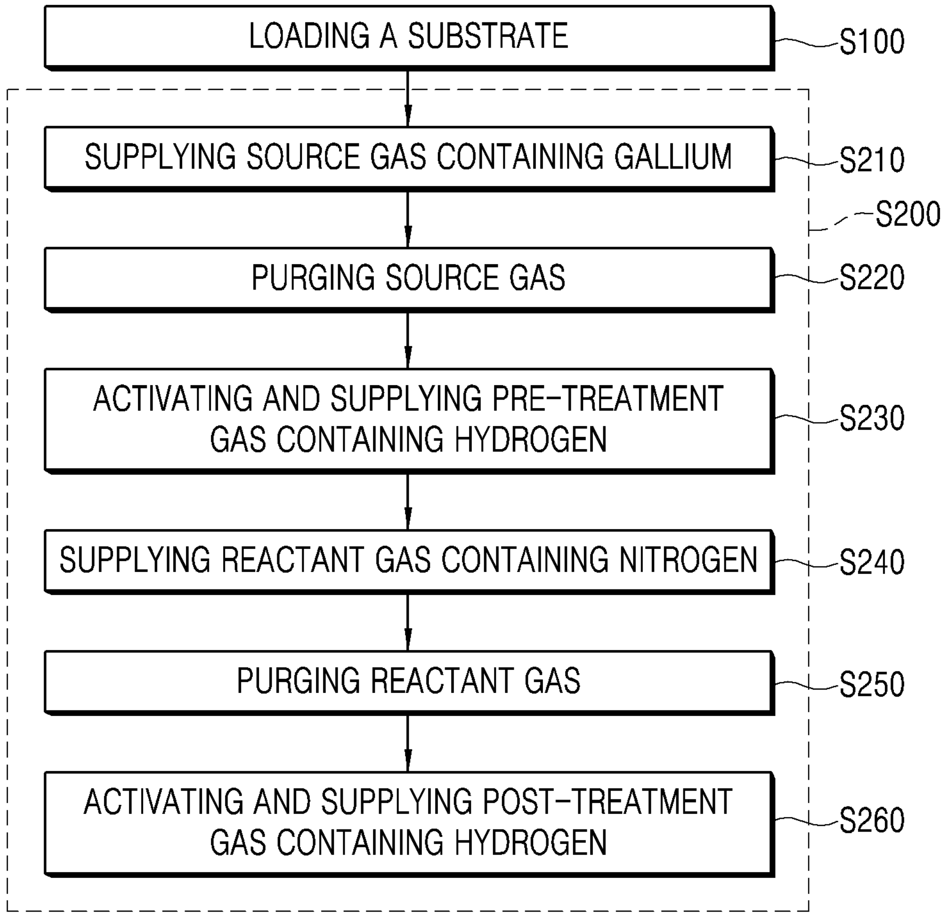
FIG. 2 is a schematic flowchart representing a thin film forming method in accordance with an exemplary embodiment.
Figure 3:
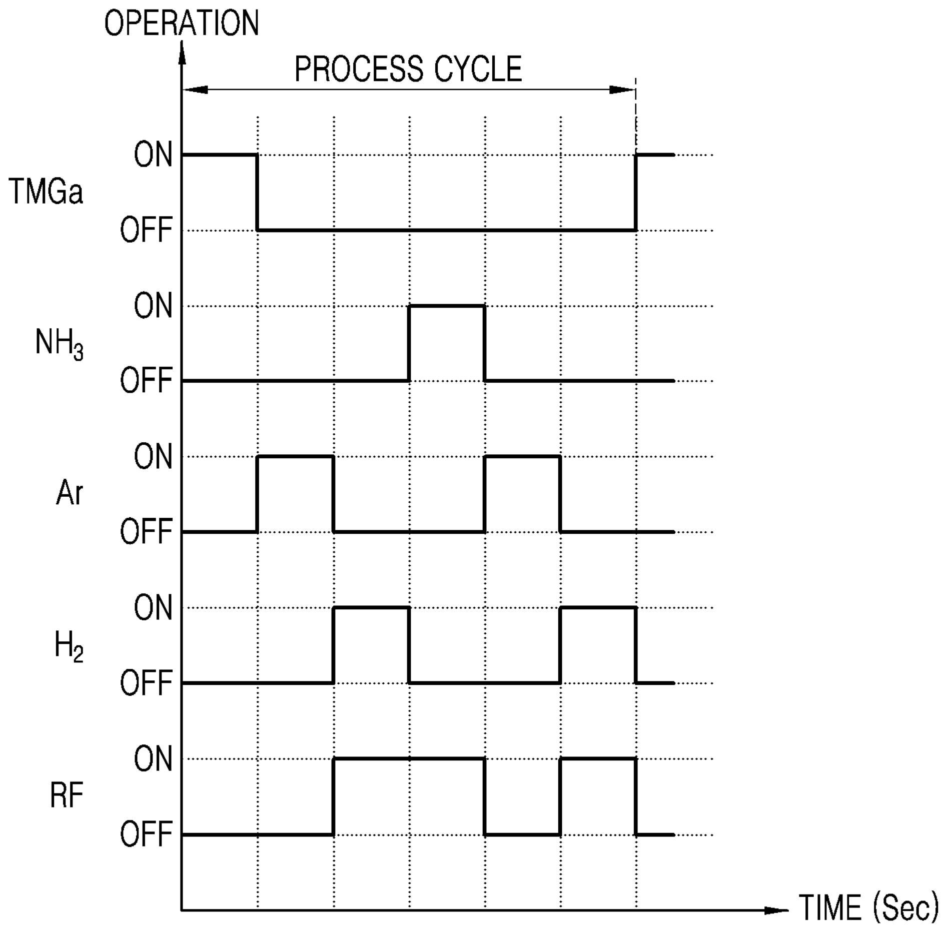
FIG. 3 is a graph for explaining a process cycle of the thin film forming method in accordance with an exemplary embodiment.

FIG. 2 is a schematic flowchart representing the thin film forming method in accordance with an exemplary embodiment, and FIG. 3 is a graph for explaining a process cycle of the thin film forming method in accordance with an exemplary embodiment.

Referring to FIGS. 2 and 3, the thin film forming method in accordance with an exemplary embodiment includes a process S100 of loading a substrate into a process space of a chamber 10 and a process S200 of forming a gallium nitride thin film on the substrate, and the process S200 of forming the gallium nitride thin film on the substrate includes a process S210 of supplying a source gas containing gallium onto the substrate, a process S240 of supplying a reactant gas containing nitrogen onto the substrate, and a process S260 of activating and supplying a post-treatment gas containing hydrogen onto the substrate.

The process S100 of loading the substrate loads the substrate into the process space of the chamber 10. The substrate loaded into the process space may be seated on a substrate support unit 20. Here, as described above, the substrate for forming the gallium nitride thin film may be one of a sapphire substrate, a glass substrate, and a silicon wafer. Alternatively, the process S100 of loading the substrate may load a substrate on which a predetermined functional layer is formed. For example, in the process S100 of loading the substrate, a substrate, in which a gate electrode is formed on a top surface thereof, and a gate insulation layer is formed on the substrate and the gate electrode to cover the gate electrode, may be loaded. Here, the substrate support unit 20 may include, e.g., an electrostatic chuck to absorb and maintain the substrate by using an electrostatic force so that the substrate is seated and supported. Alternatively, the substrate support unit 20 may support the substrate by using vacuum absorption or a mechanical force.

The process S200 of forming the gallium nitride thin film forms the gallium nitride thin film on the substrate loaded into the process space of the chamber 10. Here, the gallium nitride (GaN) thin film may form at least a portion of an active layer of a thin film transistor (TFT) used as a switching circuit in a semiconductor element or a display device. For example, the gallium nitride thin film may form a channel region between a gate electrode, a source electrode, and a drain electrode of the thin film transistor.

In accordance with an exemplary embodiment, the process S200 of forming the gallium nitride thin film may be performed in a low temperature process at a temperature of 600° C. or less. That is, the process S200 of forming the gallium nitride thin film may be performed by controlling the process space of the chamber 10 at a temperature of 250° C. or more and 600° C. or less. The gallium nitride thin film may be formed in the low temperature process in a range from 250° C. to 600° C. by an atomic layer growth (ALG) process, and this will be described in more detail below.

The process S210 of supplying the source gas supplies the source gas containing gallium onto the substrate. Here, the process S210 of supplying the source gas supplies the source gas containing gallium onto the substrate through the above-described first gas supply path of the deposition device. Here, the source gas containing gallium may include trimethyl gallium (TMGa) gas containing gallium as a primary component. The process S210 of supplying the source gas supplies the source gas containing gallium onto the substrate. Here, the process S210 of supplying the source gas may be performed without applying a power.

Although not shown in FIGS. 2 and 3, a process of supplying a dopant gas onto the substrate may be performed at the same time with the process S210 of supplying the source gas or after the process S210 of supplying the source gas. As described above, the gallium nitride thin film may form at least a portion of the active layer. The gallium nitride thin film may be formed as a p-type active layer or an n-type active layer according to the kind of the active layer. Thus, a process of supplying a p-type dopant gas or an n-type dopant gas onto the substrate may be performed at the same time with the process S210 of supplying the source gas or after the process S210 of supplying the source gas. The dopant gas may be supplied through at least one of the first gas supply path and the second gas supply path. Here, the p-type dopant gas may include a bis-cyclopentadienyl magnesium (Cp2Mg) gas, and the n-type dopant gas may include a diisopropylaminosilane (DIPAS) gas. As described above, as the p-type dopant gas or the n-type dopant gas is supplied at the same time with the process S210 of supplying the source gas or after the process S210 of supplying the source gas, a p-type gallium nitride thin film or a n-type gallium nitride thin film may be formed.

A process S220 of purging the source gas may be performed after the process S210 of supplying the source gas. The process S220 of purging the source gas may remove the source gas remained in the process space of the chamber 10. The process S220 of purging the source gas may be performed by supplying an inert gas, e.g., an argon gas (Ar), to the process space, and the argon (Ar) gas may be supplied through at least one of the first gas supply path and the second gas supply path. Here, a RF power source 50 may not apply a RF power while the source gas is purged.

A process S230 of activating and supplying a pre-treatment gas containing hydrogen onto the substrate may be performed after the process S220 of purging the source gas. The process S230 of activating and supplying a pre-treatment gas may supply the pre-treatment gas containing hydrogen, e.g., a hydrogen ($H_2$) gas, onto the substrate and apply the RF power to generate hydrogen plasma on the substrate. Here, the hydrogen ($H_2$) gas may be supplied through at least one of the first gas supply path and the second gas supply path. When the process S230 of activating and supplying the pre-treatment gas containing hydrogen is performed after a raw material is adsorbed to the substrate by the supply of the source gas, impurities contained in the raw material adsorbed to the substrate may be removed by the hydrogen plasma, and the raw material may be further firmly adsorbed to the substrate.

After the process S230 of activating and supplying the pre-treatment gas containing hydrogen, the process S240 of supplying the reactant gas is performed. The process S240 of supplying the reactant gas supplies the reactant gas containing nitrogen onto the substrate. Here, the process S240 of supplying the reactant gas supplies the reactant gas containing nitrogen onto the substrate through the above-described second gas supply path of the deposition device. Here, the reactant gas containing nitrogen may include an ammonia ($NH_3$) gas as a primary component. When the reactant gas is supplied onto the substrate to which the raw material is adsorbed, the raw material reacts with a reactant contained in the reactant gas.

Here, in the process S240 of supplying the reactant gas, the RF power source 50 may apply the RF power to the process space to activate the reactant gas and generate plasma, so that the nitrogen component effectively reacts with the gallium component. As described above, the gas containing nitrogen supplied as the reactant gas is activated and supplied in the process S240 of supplying the reactant gas and may be activated into a nitrogen radical to react with the gallium component, and the gallium nitride thin film may be formed on the substrate at a further low process temperature. That is, when the reactant gas is activated and supplied onto the substrate, the process S200 of forming the gallium nitride thin film may be performed by controlling the process space of the chamber 10 at a temperature of 250° C. or more and 600° C. or less.

A process S250 of purging the reactant gas may be performed after the process S240 of supplying the reactant gas. The process S250 of purging the reactant gas may remove the reactant gas remained in the process space of the chamber 10. The process S250 of purging the reactant gas may be performed by supplying an inert gas, e.g., an argon gas (Ar), to the process space as same as the process S220 of purging the source gas, and the argon (Ar) gas may be supplied through at least one of the first gas supply path and the second gas supply path.

The process S260 of activating and supplying the post-treatment gas containing hydrogen onto the substrate may be performed after the process S250 of purging the reactant gas. The process S260 of activating and supplying the post-treatment gas may supply the post-treatment gas containing hydrogen, e.g., a hydrogen ($H_2$) gas, onto the substrate and apply the RF power to generate hydrogen plasma on the substrate. Here, the hydrogen ($H_2$) gas may be supplied through at least one of the first gas supply path and the second gas supply path.

When the post-treatment gas containing hydrogen is activated and supplied onto the substrate after the source gas and the reactant gas are injected to form the gallium nitride thin film, the amorphous gallium nitride thin film may be crystallized by hydrogen plasma. When the gallium nitride thin film is formed by simply injecting the source gas and the reactant gas, the gallium nitride thin film in an amorphous state may be deposited on the substrate. However, when the process S260 of activating and supplying the post-treatment gas containing hydrogen onto the substrate is performed after the process S250 of purging the reactant gas is performed in accordance with an exemplary embodiment, the amorphous gallium nitride thin film may be crystallized to have a polycrystalline or single crystalline structure. Also, when the reactant gas is activated and supplied in a state in which the inside of the chamber 10 or the substrate has a low temperature, e.g., a low temperature of 250° C. to 600° C., the gallium nitride thin film may be formed in an extremely low temperature state of 250° C. to 600° C. In addition, impurities remained in the chamber or impurities contained in the gallium nitride thin film may be effectively removed by the process S260 of activating and supplying the post-treatment gas containing hydrogen onto the substrate.

Here, the thin film forming method in accordance with an exemplary embodiment may perform, a plurality of times, a process cycle including the process S210 of supplying the source gas and the process S240 of supplying the reactant gas. As at least one of the process S230 of activating and supplying the pre-treatment gas containing hydrogen and the process S260 of activating and supplying the post-treatment gas is included in each process cycle as shown in FIG. 3, the process S230 of activating and supplying the pre-treatment gas and the process S260 of activating and supplying the post-treatment gas may be performed for each process cycle. Alternatively, as at least one of the process S230 of activating and supplying the pre-treatment gas and the process S260 of activating and supplying the post-treatment gas is included in a portion of each process cycle, at least one of the process S230 of activating and supplying the pre-treatment gas and the process S260 of activating and supplying the post-treatment gas may be performed only during a portion of the process cycle.

For example, when the process S230 of activating and supplying the pre-treatment gas and the process S260 of activating and supplying the post-treatment gas are included in each process cycle, the thin film forming method in accordance with an exemplary embodiment may form one process cycle including the process S210 of supplying the source gas, the process S220 of purging the source gas, the process S230 of activating and supplying the pre-treatment gas containing hydrogen, the process S240 of supplying the reactant gas, the process S250 of purging the reactant gas, and the process S260 of activating and supplying the post-treatment gas, and the process cycle may be repeatedly performed until the gallium nitride thin film having a preferred thickness is formed on the substrate.

Figure 4:
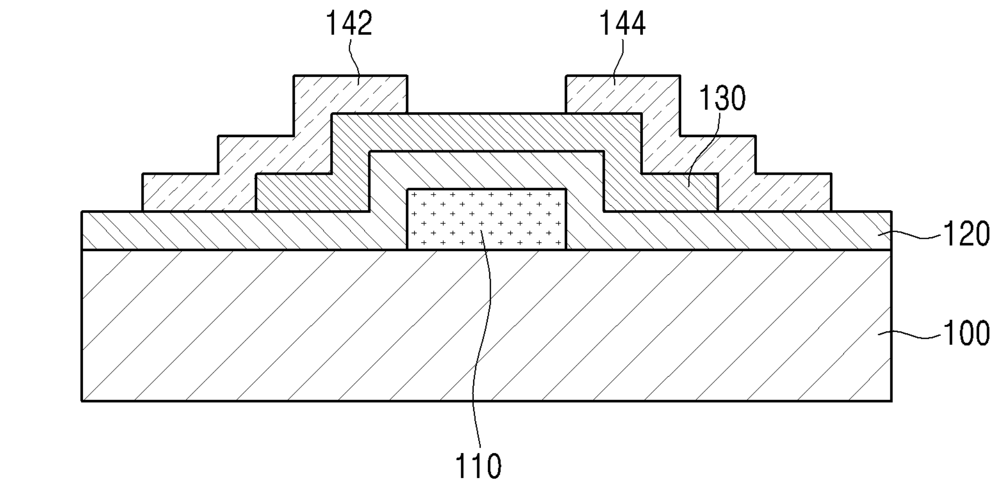
FIG. 4 is a schematic view illustrating a thin film transistor manufactured in accordance with an exemplary embodiment.

FIG. 4 is a schematic view illustrating the thin film transistor manufactured in accordance with an exemplary embodiment. That is, FIG. 4 illustrates the thin film transistor manufactured by forming the active layer including the gallium nitride thin film through the thin film forming method in accordance with an exemplary embodiment.

Referring to FIG. 4, the thin film transistor in accordance with an exemplary embodiment includes a gate electrode 110, a source electrode 142 and a drain electrode 144 disposed above or below the gate electrode 110 and spaced apart from each other in a horizontal direction, an active layer 130 disposed between the gate electrode 110, the source electrode 142, and the drain electrode 144, and a gate insulation layer 120 disposed between the gate electrode 110 and the active layer 130, and at least a portion of the active layer 130 is formed by the gallium nitride thin film.

Here, as illustrated in FIG. 4, the thin film transistor in accordance with an exemplary embodiment may be a bottom gate type thin film transistor including the gate electrode 110 formed on a substrate 100, the gate insulation layer 120 formed on the gate electrode 110, the active layer formed on the gate insulation layer 120, and the source electrode 142 and the drain electrode 144 spaced apart from each other on the active layer 130. Alternatively, the thin film transistor may be a top gate type thin film transistor in which the gate electrode 110 is disposed at an upper portion thereof.

Here, the substrate 100 may include various substrates for forming the gallium nitride (GaN) thin film. For example, the substrate may be one of a sapphire substrate, a glass substrate, and a silicon wafer. In addition, the substrate may include various substrates such as a transparent substrate or a flexible substrate.

The gate electrode 110 may be made of a conductive material. For example, the gate electrode 110 may be made of at least one metal of aluminum (Al), neodymium (Nd), silver (Ag), chrome (Cr), titanium (Ti), tantalum (Ta), molybdenum (Mo), and copper (Cu) or an alloy thereof. Also, the gate electrode 110 may be formed as multiple layers consisting of a plurality of metal layers in addition to being formed as a single layer. That is, the gate electrode 110 may be formed as double layers including a metal layer made of metal having an excellent physicochemical characteristic such as chrome (Cr), titanium (Ti), or molybdenum (Mo) and a metal layer made of metal having a low specific resistance such as aluminum (Al)-based metal, silver (Ag)-based metal, or copper (Cu)-based metal.

The gate insulation layer 120 may be formed on the gate electrode 110. That is, the gate insulation layer 120 may be formed on the substrate 100 including an upper and side portions of the gate electrode 110. The gate insulation layer 120 may be a thin film made of one or more insulating materials having an excellent adhesion property to a metal material and an excellent insulation withstand voltage such as a silicon oxide ($SiO_2$), a silicon nitride (SiN), a high-K dielectric material, and an aluminum oxide ($Al_2O_3$). Here, the high-K dielectric material may have a dielectric constant higher than that of the silicon oxide ($SiO_2$) and include a hafnium oxide ($HfO_2$) and a zirconium oxide ($ZrO_2$).

The active layer 130 is formed on the gate insulation layer 120, and at least a portion of the active layer 130 overlaps the gate electrode 110. The active layer 130 may include the gallium nitride thin film. As described above, the gallium nitride thin film may be formed by the thin film forming method in accordance with an exemplary embodiment, which includes the process S100 of loading the substrate into the process space of the chamber 10 and the process S200 of forming the gallium nitride thin film on the substrate. Here, the process S200 of forming the gallium nitride thin film on the substrate may include the process S210 of supplying the source gas containing gallium onto the substrate, the process S240 of supplying the reactant gas containing nitrogen onto the substrate, and the process S260 of activating and supplying the post-treatment gas containing hydrogen onto the substrate.

Although not shown in FIG. 4, the gallium nitride thin film may be formed directly on the gate insulation layer 120. Alternatively, the gallium nitride thin film may be formed on a buffer layer after the buffer layer is formed on the gate insulation layer. Here, the buffer layer may be formed earlier than the gallium nitride thin film to form the gallium nitride thin film and a seed layer to assist the gallium nitride thin film to be further effectively crystallized. That is, the buffer layer may be a seed layer allowing the gallium nitride thin film to be further easily crystallized when the gallium nitride thin film is formed. The buffer layer may be formed as an aluminum nitride (AlN) thin film and formed by various thin film forming processes such as an atomic layer deposition method or a chemical vapor deposition method.

The source electrode 142 and the drain electrode 144 may be formed on the active layer 130, i.e., the gallium nitride thin film. The source electrode 142 and the drain electrode 144 may be spaced apart from each other with the gate electrode 110 therebetween while partially overlapping the gate electrode 110. The source electrode 142 and the drain electrode 144 may be made of the same conductive material by the same process. For example, the source electrode 142 and the drain electrode 144 may be made of at least one metal of aluminum (Al), neodymium (Nd), silver (Ag), chrome (Cr), titanium (Ti), tantalum (Ta), molybdenum (Mo), and copper (Cu) or an alloy thereof. That is, the source electrode 142 and the drain electrode 144 may be made of the same material as the gate electrode 110 or a different material from that of the gate electrode 110. Also, each of the source electrode 142 and the drain electrode 144 may be formed by a single layer or multiple layers consisting of a plurality of metal layers.

Figure 5:
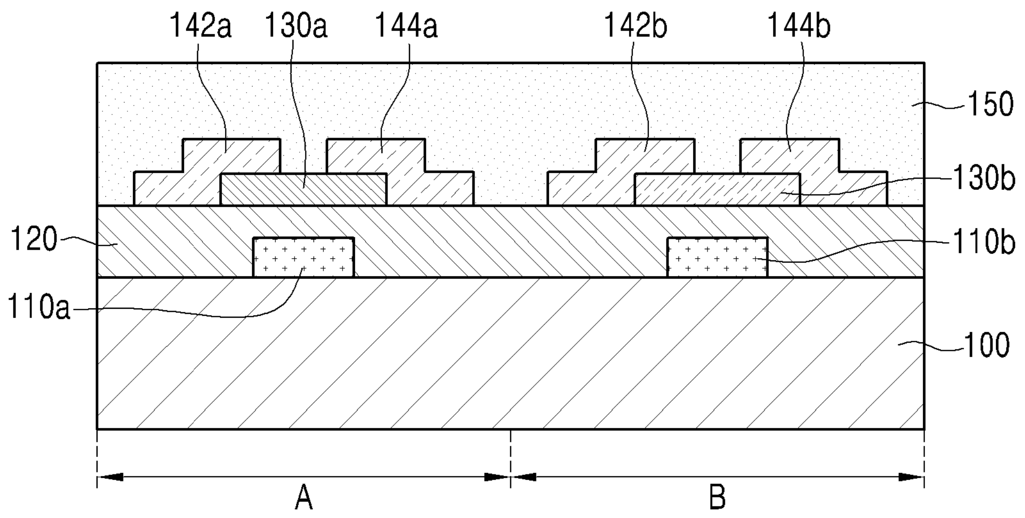
FIG. 5 is a schematic view illustrating a semiconductor element manufactured in accordance with an exemplary embodiment.

FIG. 5 is a schematic view illustrating a semiconductor element manufactured in accordance with an exemplary embodiment. That is, FIG. 5 illustrates the semiconductor element manufactured by forming at least one of the p-type gallium nitride thin film including the p-type active layer and the n-type active layer including the n-type gallium nitride thin film through the thin film forming method in accordance with an exemplary embodiment.

Referring to FIG. 5, the semiconductor element in accordance with an exemplary embodiment includes a substrate 100 having a first area A and a second area B, a first thin film transistor disposed on the first area A and having a p-type active layer 130*a*, and a second thin film transistor disposed on the second area B and having an n-type active layer 130*b*.

Here, as illustrated in FIG. 5, the semiconductor element in accordance with an exemplary embodiment may include a bottom gate type thin film transistor in which an active layer is disposed on a gate electrode. Alternatively, the semiconductor element may include a top gate type thin film transistor in which a gate electrode is disposed on an active layer.

Here, the above-described features related to the thin film transistor in FIG. 4 may be applied to the substrate 100. The substrate 100 has the first area A and the second area B different from the first area A. Here, the first area A represents an area on the substrate 100 on which the first thin film transistor is formed, and the second area B represents an area on the substrate 100 on which the second thin film transistor is formed. Although the first area A and the second area B are disposed adjacent to each other in FIG. 5, the first area A and the second area B may be disposed at various divided positions on the substrate 100 to form the first thin film transistor and the second thin film transistor. For example, the first area A and the second area B may be spaced a predetermined distance from each other.

The first thin film transistor is disposed on the first area A of the substrate 100 and has the p-type active layer 130*a*. That is, the first thin film transistor may be a p-type thin film transistor having the p-type active layer 130*a* as the active layer. Also, the second thin film transistor is disposed on the second area B of the substrate 100 and has the n-type active layer 130*b*. That is, the second thin film transistor may be an n-type thin film transistor having the n-type active layer 130*b* as the active layer.

Here, the first thin film transistor and the second thin film transistor respectively include a first gate electrode 110*a* and a second gate electrode 110*b*, a gate insulation layer 120, and a first source electrode 142*a* and a first drain electrode 144*a* and a second source electrode 142*b* and a second drain electrode 144*b*. As described above, the semiconductor element in accordance with an exemplary embodiment includes the bottom gate type thin film transistor. Thus, the first thin film transistor may include a first gate electrode 110*a* formed on the substrate 100, a gate insulation layer 120 formed on the first gate electrode 110*a*, a p-type active layer 130*a* formed on the gate insulation layer 120, and a first source electrode 142*a* and a first drain electrode 144*a* spaced apart from each other on the p-type active layer 130*a*. Also, the second thin film transistor may include a second gate electrode 110*b* formed on the substrate 100, a gate insulation layer 120 formed on the second gate electrode 110*b*, an n-type active layer 130*b* formed on the gate insulation layer 120, and a second source electrode 142*b* and a second drain electrode 144*b* spaced apart from each other on the n-type active layer 130*b*. Here, as illustrated in FIG. 5, the first thin film transistor and the second thin film transistor may share the gate insulation layer 120.

The first gate electrode 110*a* and the second gate electrode 110*b* may at least partially overlap the p-type active layer 130*a* and the n-type active layer 130*b*, respectively. Since the above-described features related to the thin film transistor in FIG. 4 may be applied to the first gate electrode 110*a* and the second gate electrode 110*b*, overlapped descriptions thereof will be omitted.

The gate insulation layer 120 may be formed on the first gate electrode 110*a* and the second gate electrode 110*b*. That is, the gate insulation layer 120 may be formed on the first gate electrode 110*a* and the second gate electrode 110*b*. Since the above-described features related to the thin film transistor in FIG. 4 may be applied to the gate insulation layer 120, overlapped descriptions thereof will be omitted.

The p-type active layer 130*a* is formed between the gate insulation layer 120, the first source electrode 142*a*, and the first drain electrode 144*a* as the active layer of the first thin film transistor, and the n-type active layer 130*b* is formed between the gate insulation layer 120, the second source electrode 142*b*, and the second drain electrode 144*b* as the active layer of the second thin film transistor.

Here, the p-type active layer 130*a* may include a p-type gallium nitride thin film. That is, the p-type active layer 130*a* may include the p-type gallium nitride thin film doped with magnesium. Also, the n-type active layer 130*b* may include an n-type gallium nitride thin film. That is, the n-type active layer 130*b* may include the n-type gallium nitride thin film doped with silicon. However, the n-type active layer 130*b* may include at least one of a Zn-based oxide (a binary, ternary or quaternary oxide including ZnO and Zn) an In-based oxide (a binary, ternary or quaternary oxide including InO and In), and a Ga-based oxide (a binary, ternary or quaternary oxide including GaO and Ga) in addition to the n-type gallium nitride thin film. In addition, the n-type active layer 130*b* may include an indium-zinc oxide (IZO; In—Zn—O) or an indium-gallium-zinc oxide (IGZO; In—Ga—Zn—O).

In the semiconductor element in accordance with an exemplary embodiment, each of the p-type active layer 130*a* and the n-type active layer 130*b* may have a multiple layer structure. That is, the p-type active layer 130*a* may have the multiple layer structure including a first p-type active layer and a second p-type active layer, and the n-type active layer 130*b* may have the multiple layer structure including a first n-type active layer and a second n-type active layer. Here, the first p-type active layer may include a gallium nitride thin film undoped with magnesium, and the second p-type active layer may include a gallium nitride thin film doped with magnesium. Also, the first n-type active layer may include a gallium nitride thin film undoped with silicon, and the second n-type active layer may include a gallium nitride thin film doped with silicon.

Here, in the semiconductor element in accordance with an exemplary embodiment, the p-type active layer 130*a* and the n-type active layer 130*b* may be formed by the thin film forming method in accordance with an exemplary embodiment. That is, each of the p-type active layer 130*a* and the n-type active layer 130*b* may include the doped gallium nitride thin film. As described above, the doped gallium nitride thin film may be formed by the thin film forming method including the process S100 of loading the substrate into the process space of the chamber 10 and the process S200 of forming the gallium nitride thin film on the substrate. Here, the process S200 of forming the gallium nitride thin film on the substrate may include the process S210 of supplying the source gas containing gallium onto the substrate, a process of supplying a doping gas onto the substrate simultaneously with or after the source gas, the process S240 of supplying the reactant gas containing nitrogen onto the substrate, and the process S260 of activating and supplying the post-treatment gas containing hydrogen onto the substrate.

The first source electrode 142*a* and the first drain electrode 144*a* may be formed on the p-type active layer 130*a*, and the second source electrode 142*b* and the second drain electrode 144*b* may be formed on the n-type active layer 130*b*. The first source electrode 142*a* and the first drain electrode 144*a* may be spaced apart from each other so that at least a portion of each thereof is connected to the p-type active layer 130*a*, and the second source electrode 142*b* and the second drain electrode 144*b* may be spaced apart from each other so that at least a portion of each thereof is connected to the n-type active layer 130*b*. Since the above-described features related to the thin film transistor in FIG. 4 may be applied to the first source electrode 142*a* and the first drain electrode 144*a* and the second source electrode 142*b* and the second drain electrode 144*b*, overlapped descriptions thereof will be omitted.

A passivation layer 150 may be formed on the first source electrode 142*a* and the first drain electrode 144*a* and the second source electrode 142*b* and the second drain electrode 144*b*. That is, the passivation layer 150 may be formed on the gate insulation layer 120, the p-type active layer 130*a*, the first source electrode 142*a*, the first drain electrode 144*a*, the n-type active layer 130*b*, the second source electrode 142*b*, and the second drain electrode 144*b*. Here, the passivation layer 150 may prevent surface corrosion of the semiconductor element and protect the semiconductor element from an external environment. The passivation layer 150 may be made of one or more of a silicon oxide ($SiO_2$) and a silicon nitride (SiN).

In accordance with the exemplary embodiment, as the gallium nitride thin film is formed through the low temperature process, the substrate or the gallium nitride thin film may be prevented from being damaged by the high temperature heat. Also, the time for increasing the temperature of the substrate to form the gallium nitride thin film may be saved, and thus, the time for manufacturing the semiconductor element or the display device may be reduced.

Also, in accordance with the exemplary embodiment, the gallium nitride thin film having the crystalline structure with the high carrier concentration and the excellent electrical conductivity may be formed through the low temperature process.

Although the specific embodiments are described and illustrated by using specific terms, the terms are merely examples for clearly explaining the embodiments, and thus, it is obvious to those skilled in the art that the embodiments and technical terms can be carried out in other specific forms and changes without changing the technical idea or essential features. Therefore, it should be understood that simple modifications according to the embodiments of the present inventive concept may belong to the technical spirit of the present inventive concept.

What is claimed is:

1. A thin film forming method comprising:

loading a substrate into a process space of a chamber; and forming a gallium nitride thin film on the substrate, wherein the forming of the gallium nitride thin film comprises:

supplying a source gas containing gallium onto the substrate;

supplying a reactant gas containing nitrogen onto the substrate; and activating and supplying a post-treatment gas containing hydrogen onto the substrate, wherein a substrate support unit that supports the substrate and a gas injection unit disposed to face the substrate support unit are provided in the chamber, and the gas injection unit comprises:

an upper frame; and a lower frame, spaced apart from the lower side of the upper frame and installed a first electrode and a second electrode spaced apart from the first electrode, provided on a lower surface thereof;

wherein the supplying the reactant gas activates the reactant gas in the gas injection unit, which includes a spaced apart space between the first electrode and the second electrode, and injects the reactant gas onto the substrate.

2. The thin film forming method of claim 1, wherein the forming of the gallium nitride thin film is performed by controlling a temperature of the process space to be equal to or less than 600° C.

3. The thin film forming method of claim 1, wherein the supplying of the reactant gas supplies the reactant gas onto the substrate through a supply path different from that of the source gas.

4. The thin film forming method of claim 1, wherein the forming of the gallium nitride thin film is performed by controlling a temperature of the process space to be equal to or less than 350° C.

5. The thin film forming method of claim 1, wherein the forming of the gallium nitride thin film further comprises activating and supplying a pre-treatment gas containing hydrogen onto the substrate before the supplying of the reactant gas.

6. The thin film forming method of claim 5, wherein the forming of the gallium nitride thin film further comprises purging the source gas before the activating and supplying of the pre-treatment gas.

7. The thin film forming method of claim 1, wherein the forming of the gallium nitride thin film further comprises purging the reactant gas before the activating and supplying of the post-treatment gas.

8. The thin film forming method of claim 1, wherein the source gas comprises a trimethyl gallium (TMGa) gas, the reactant gas comprises an ammonia (NH3) gas, and the post-treatment gas comprises a hydrogen (H2) gas.

9. The thin film forming method of claim 1, further comprising forming a buffer layer on the substrate before the forming of the gallium nitride thin film, wherein the buffer layer comprises an aluminum nitride thin film.

10. The thin film forming method of claim 1, wherein the forming of the gallium nitride thin film performs, a plurality of times, a process cycle comprising the supplying of the source gas, the supplying of the reactant gas, and the activating and supplying of the post-treatment gas.

11. The thin film forming method of claim 1, wherein the forming of the gallium nitride thin film further comprises supplying a dopant gas onto the substrate, and the supplying of the dopant gas supplies the dopant gas simultaneously with or after the supplying of the source gas.

12. The thin film forming method of claim 11, wherein the dopant gas comprises a p-type dopant gas or an n-type dopant gas, the p-type dopant gas comprises a bis-cyclopentadienyl magnesium (Cp2Mg) gas, and the n-type dopant gas comprises a diisopropylaminosilane (DIPAS) gas.

13. A thin film forming method comprising:

loading a substrate into a process space of a chamber; and forming a gallium nitride thin film on the substrate, wherein the forming of the gallium nitride thin film comprises:

supplying a source gas containing gallium onto the substrate; and supplying a reactant gas containing nitrogen onto the substrate, wherein the forming of the gallium nitride thin film is performed by controlling a temperature of the process space to be equal to or less than 600° C., wherein a substrate support unit that supports the substrate and a gas injection unit disposed to face the substrate support unit are provided in the chamber, and the gas injection unit comprises:

an upper frame; and a lower frame, spaced apart from the lower side of the upper frame and installed a first electrode and a second electrode spaced apart from the first electrode, provided on a lower surface thereof;

wherein the supplying the reactant gas activates the reactant gas in the gas injection unit, which includes a spaced apart space between the first electrode and the second electrode, and injects the reactant gas onto the substrate.

14. The thin film forming method of claim 13, further comprising activating and supplying a gas containing hydrogen onto the substrate after the supplying a source gas.

15. The thin film forming method of claim 13, wherein the forming of the gallium nitride thin film is performed by controlling a temperature of the process space to be equal to or less than 350° C.

16. A thin film forming method comprising:

loading a substrate into a process space of a chamber; and forming a gallium nitride thin film on the substrate, wherein the forming of the gallium nitride thin film comprises:

supplying a source gas containing gallium onto the substrate; and activating and supplying a reactant gas containing nitrogen onto the substrate, wherein a substrate support unit that supports the substrate and a gas injection unit disposed to face the substrate support unit are provided in the chamber, and the gas injection unit comprises:

an upper frame; and a lower frame, spaced apart from the lower side of the upper frame and installed a first electrode and a second electrode spaced apart from the first electrode, provided on a lower surface thereof;

wherein the supplying the reactant gas activates the reactant gas in the gas injection unit, which includes a spaced apart space between the first electrode and the second electrode, and injects the reactant gas onto the substrate.

17. The thin film forming method of claim 16, further comprising activating and supplying a gas containing hydrogen onto the substrate after the supplying a source gas.

* * * * *